(12) United States Patent
Chen (10) Patent No.: US 10,732,899 B2
(45) Date of Patent: Aug. 4, 2020

(54) ERROR RECOVERY OF CROSS-DIE LOGICAL PAGES IN A SOLID STATE DEVICE

(71) Applicant: Western Digital Technologies, Inc., San Jose, CA (US)

(72) Inventor: Xiaoheng Chen, Dublin, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 147 days.

(21) Appl. No.: 16/138,476

(22) Filed: Sep. 21, 2018

(65) Prior Publication Data

US 2019/0107973 A1 Apr. 11, 2019

Related U.S. Application Data

(60) Provisional application No. 62/569,359, filed on Oct. 6, 2017.

(51) Int. Cl.
*G06F 3/06* (2006.01)
*G11C 16/26* (2006.01)
*G11C 11/56* (2006.01)
*G11C 16/04* (2006.01)

(52) U.S. Cl.
CPC .......... *G06F 3/0659* (2013.01); *G06F 3/0619* (2013.01); *G06F 3/0685* (2013.01); *G11C 11/5642* (2013.01); *G11C 16/26* (2013.01); *G11C 16/0483* (2013.01)

(58) Field of Classification Search
CPC .... G06F 3/0619; G06F 3/0659; G06F 3/0685; G11C 16/0483; G11C 16/26; G11C 11/5642
See application file for complete search history.

(56) References Cited

U.S. PATENT DOCUMENTS

| 2014/0149825 | A1* | 5/2014 | Motwani | H03M 13/3723 714/764 |
| 2017/0236592 | A1* | 8/2017 | Alhussien | G11C 29/50004 714/721 |
| 2017/0269991 | A1* | 9/2017 | Bazarsky | G06F 11/1012 |
| 2018/0046527 | A1* | 2/2018 | Reusswig | G06F 11/076 |
| 2018/0158493 | A1* | 6/2018 | Ryu | G11C 7/1006 |
| 2019/0108091 | A1* | 4/2019 | Chen | G06F 11/1068 |

* cited by examiner

*Primary Examiner* — Zhuo H Li
(74) *Attorney, Agent, or Firm* — Loza & Loza, LLP; Gabriel Fitch (57) ABSTRACT

Exemplary methods and apparatus are provided to reduce read retry latency within solid state devices (SSDs) with non-volatile memories (NVMs). The reduction in read retry latency may be accomplished in some examples by prioritizing read recovery of a regular codeword over an irregular codeword for a cross-die logical page, irrespective of the location in the page with read errors. In an illustrative example, a processor (a) performs a read retry for a second codeword by setting a read voltage level to a first level for a first die, then advancing through a read retry table for the second die until the second codeword is read successfully, and (b) then performs a read retry for the first codeword by setting a read voltage level for the second die to a second level, then advancing through a read retry table for the first die until the first codeword is successfully read.

20 Claims, 9 Drawing Sheets

ERROR RECOVERY OF CROSS-DIE LOGICAL PAGES IN A SOLID STATE DEVICE

CLAIM OF PRIORITY UNDER 35 U.S.C. § 119

The present Application for Patent claims priority to Provisional Application No. 62/569,359, entitled "METHODS AND APPARATUS FOR ERROR RECOVERY OF CROSS-DIE LOGICAL PAGES IN A SOLID STATE DRIVE," filed Oct. 6, 2017, which is assigned to the assignee hereof and hereby expressly incorporated by reference herein.

FIELD

The disclosure relates, in some embodiments, to data storage devices, such as solid state devices (SSD) that employ controllers to access non-volatile memory arrays. More specifically, but not exclusively, the disclosure relates to methods and apparatus for error recovery of cross-die logical pages in SSD devices.

INTRODUCTION

In a variety of consumer electronics, solid state devices (SSDs) incorporating non-volatile memories (NVMs) are replacing or supplementing conventional rotating hard disk drives for mass storage. NVMs may include one or more flash memory devices, such as NAND flash memories. The NVMs may also include multiple NAND flash dies or chips that comprise the NVM. Due to high error rates that occur when reading or writing data from NAND flash memories, error correction procedures (e.g., error correction codes (ECCs) and algorithms) and read retry operations (in the instances of reading logical pages) may be used to improve SSD reliability and data integrity. Read retry may be managed with the use of a read retry table that keeps track of a sequential order of identifiers corresponding to read retry voltage values to be used for retry of decoding failed pages.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides an apparatus that includes: a memory array with first and second dies, wherein a first codeword is stored across the first and second dies and a second codeword is stored on the second die; and a processor configured to (a) perform a read retry operation for the second codeword by setting a read voltage level to a first predetermined voltage level for the first die, and advancing sequentially through entries of a read retry table for the second die until the second codeword is read successfully, and (b) perform a read retry operation for the first codeword by setting a read voltage level for the second die to a second predetermined voltage level, and advancing sequentially through entries of a read retry table for the first die until the first codeword is successfully read.

Another embodiment of the disclosure provides a method for operating a solid state device (SSD) including a non-volatile memory (NVM) having first and second dies, where the method includes: setting a read voltage level to a first predetermined level for the first die of the NVM, wherein a first codeword is stored across the first die and the second die of the NVM; advancing sequentially through entries of a read retry table for the second die until a second codeword stored on the second die is read successfully, wherein the second codeword is stored only on the second die; setting a read voltage level for the second die to a second predetermined voltage level; and advancing sequentially through entries of a read retry table for the first die until the first codeword stored across the first die and the second die is successfully read.

Another embodiment of the disclosure provides an apparatus that includes: means for maintaining a read retry tables for a first die and a second die of an NVM; means for setting a read voltage level to a first predetermined level for the first die, where a first codeword is stored across the first die and a second die of the NVM; means for advancing sequentially through entries of the read retry table for the second die until a second codeword stored on the second die is read successfully, wherein the second codeword is stored on the second die; means for setting a read voltage level for the second die to a second predetermined voltage level; and means for advancing sequentially through entries of the read retry table for the first die until the first codeword is successfully read.

DETAILED DESCRIPTION

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The main examples herein relate to data storage devices or data storage apparatus for use with host devices, where the device or apparatus may be a solid state device (SSD) such as a solid state drive. In many examples, the SSD includes a non-volatile memory (NVM) array, which is one example of a physical memory array.

As noted above, read retry may be managed with the use of a read retry table that keeps track of a sequential order of identifiers corresponding to read retry voltage values to be used for retry of decoding failed pages. Of further note is that logical pages are the smallest addressable unit for read and write operations in SSDs. Each logical page usually contains multiple error correction codes (ECCs) codewords. For storage efficiency, cross-die logical pages may be employed where a logical page is stored on at least two memory dies (e.g., across two NAND dies). Unless the logical pages occur such that the die boundary is located in between two codewords, the cross-die logical pages may contain at least two types of codewords, which increases complexity and read retry latency.

The methods and apparatus disclosed herein can reduce the read retry latency from a relatively high level of complexity to a relatively low level of complexity in order to reduce read retry latency. In an example, the methods and apparatus significantly reduce the complexity and read retry latency time. The reduction in complexity is accomplished, at least in part, by prioritizing a read recovery of a regular codeword over an irregular codeword for a cross-die logical page irrespective of the relative location in the logical page with read errors.

Figure 1:
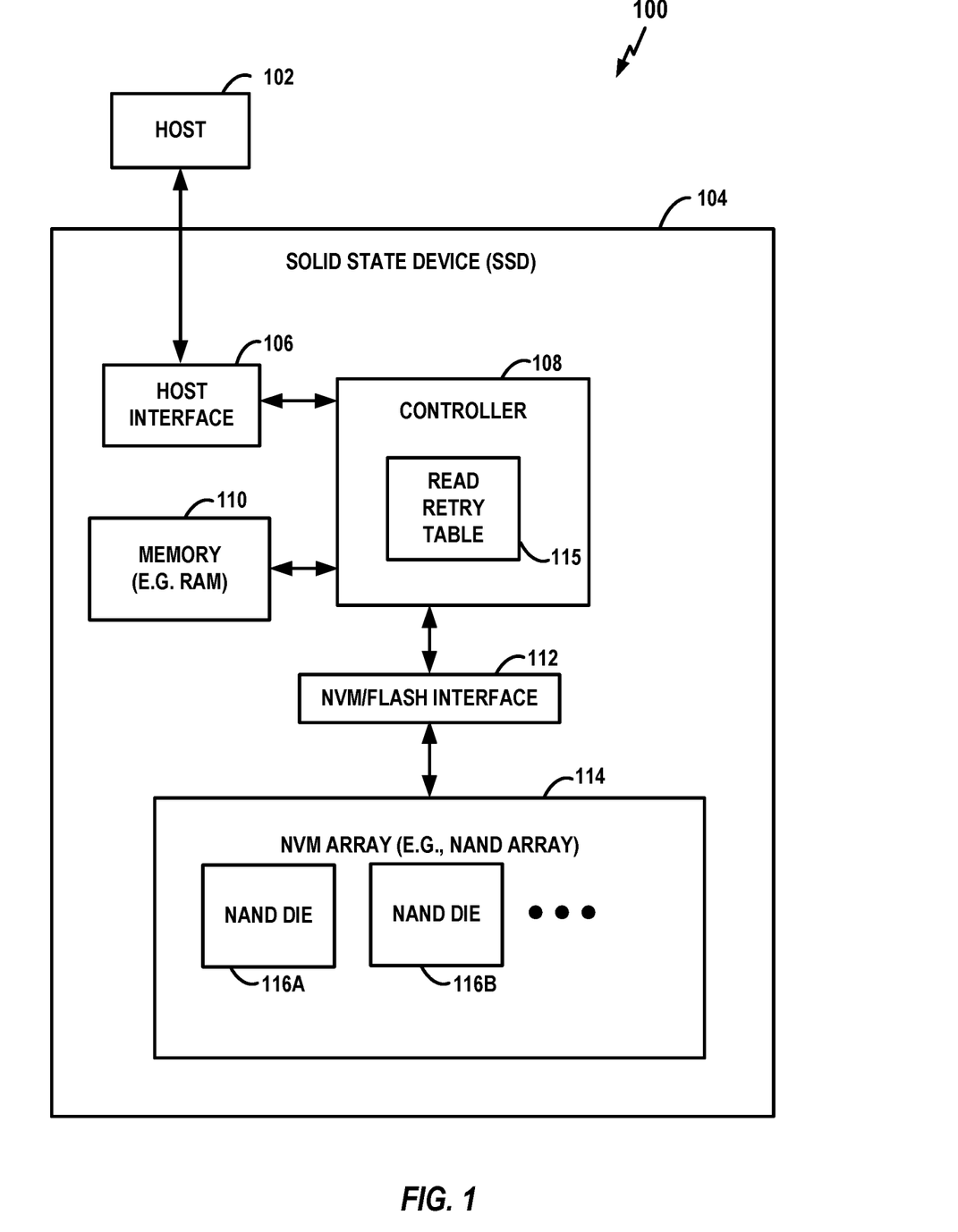
FIG. 1 shows a schematic block diagram configuration for an exemplary solid state device (SSD) having one or more non-volatile memory (NVM) arrays.

FIG. 1 is a block diagram of a system 100 including an exemplary SSD in which the methods and/or algorithms herein may be implemented in accordance with aspects of the disclosure. The system 100 includes a host 102 and a SSD 104 coupled to the host 102. The host 102 provides commands to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may be any system or device having a need for data storage or retrieval and a compatible interface for communicating with the SSD 104. For example, the host 102 may a computing device, a personal computer, a portable computer, a workstation, a server, a personal digital assistant, a digital camera, or a digital phone as merely a few examples.

The SSD 104 includes a host interface 106, a controller 108 (or alternatively, an NVM controller 108), which also includes a memory 110 (such as a random access memory (RAM)), an NVM interface 112 (which may also be referred to as a Flash memory interface), and an NVM 114, such as a NAND Flash memory, for example. The host interface 106 is coupled to the controller 108 and facilitates communication between the host 102 and the controller 108. Additionally, the controller 108 is coupled to the memory 110 as well as the NVM 114 via the NVM interface 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host 102 includes the SSD 104. In other embodiments, the SSD 104 is remote from the host 102 or is contained in a remote computing system communicatively coupled with the host 102. For example, the host 102 may communicate with the SSD 104 through a wireless communication link.

The controller 108 controls operation of the SSD 104. In various aspects, the controller 108 receives commands from the host 102 through the host interface 106 and performs the commands to transfer data between the host 102 and the NVM 114. Furthermore, the controller 108 may manage reading from and writing to memory 110 for performing the various functions effected by the controller and to maintain and manage cached information stored in memory 110.

The controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements.

The memory 110 may be any suitable memory, computing device, or system or apparatus capable of storing data. For example, the memory 110 may be ordinary RAM, dynamic RAM (DRAM), double data rate (DDR) RAM (DRAM), static RAM (SRAM), synchronous dynamic RAM (SDRAM), a flash storage, an erasable programmable read-only-memory (EPROM), an electrically erasable programmable ROM (EEPROM), or the like. In various embodiments, the controller 108 uses the memory 110, or a portion thereof, to store data during the transfer of data between the host 102 and the NVM 114. For example, the memory 110 or a portion of the memory 110 may be a cache memory.

The NVM 114 receives data from the controller 108 via the NVM interface 112 and stores the data. The NVM 114 may be any type of non-volatile memory, such as a flash storage system, a NAND-type flash memory, a solid state drive, a flash memory card, a secure digital (SD) card, a universal serial bus (USB) memory device, a CompactFlash card, a SmartMedia device, a flash storage array, or the like. The NVM may further be constructed with a number of memory die, as illustrated by NAND memory dies 116A, 116B, and so forth. It is also noted that the controller 108 may also include hardware, firmware, software, or any combinations thereof that implement read retry, as will be discussed herein.

In the example of FIG. 1, the controller 108 may also include hardware, firmware, software, or any combinations thereof that implement read retry, as will be discussed herein. The read retry algorithms or procedures may include the use of at least one read retry table 115 that is used for ordering of read retry. Although illustrated within controller 108, the read retry table 115 may be implemented and/or stored within memory 110, the NAND array 114, or even within the host 104. Read recovery flow is often used in SSDs when there is a read error. For example, a high bit error rate (BER) from the read sensing causes the decoding failure of error correction codes (ECCs). An additionally utilized read retry allows a NAND controller (such as controller 108)

to repeatedly perform a read operation while changing or adjusting a level of a read voltage according to the read voltages listed on the read retry table until the read operation on a selected page is passed (i.e., successful ECC decoding occurs). Read level adjustment is an effective tool for finding a better or best read level for successful ECC decoding. The read retry often follows a static ordering of read retry entries. For example, when the logical page of a multi-level cell (MLC) device has a read failure, the read retry is a trial-and-error process starting from an indexed 0 in the table (e.g., 115) to the last entry of the retry table that is executed until successful decoding occurs.

Each logical page usually contains multiple ECC codewords, and may also include codewords that cross over two memory die, such as die 116A and 116B of FIG. 1. This type of codeword may be referred to herein as a "cross-die" codeword.

Figure 2:
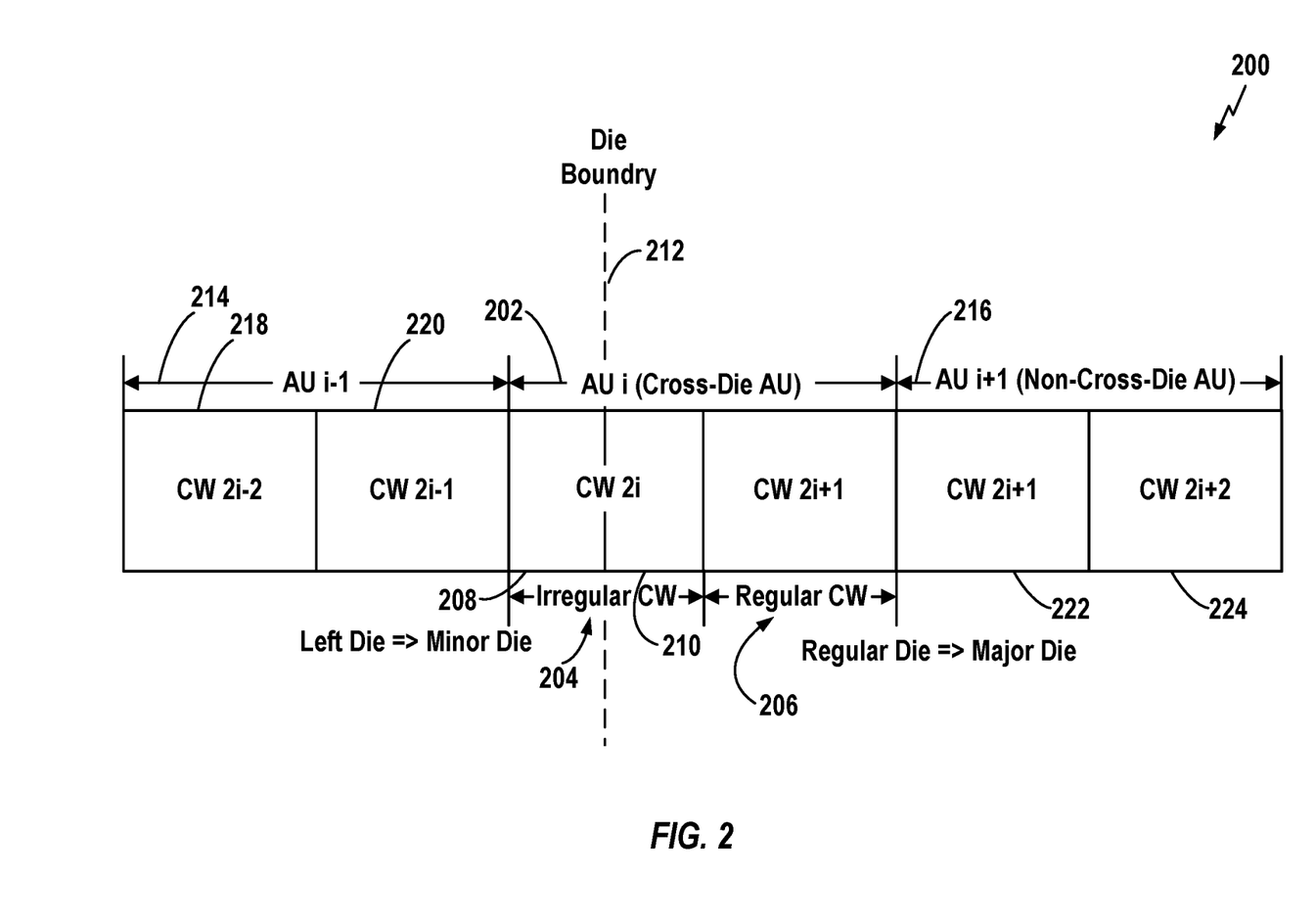
FIG. 2 illustrates an example of codewords for logical pages including a cross-die codeword.

FIG. 2 illustrates an example 200 of codewords for logical pages including a cross-die codeword. Again, it is noted that unless a die boundary is located between two codewords, a cross-die logical page will contain two types of codewords, where one codeword is a non-cross-die codeword and the other is a cross-die codeword. The non-cross-die codeword may also be considered or referred to as a "regular codeword," and the cross-die codeword may be considered or referred to be an "irregular codeword."

As illustrated in FIG. 2, each logical page, which is designated as with a designation "AU," includes at least two codewords (designated as "CW"). The illustrated example includes a cross-die logical page AUi at 202 having a first codeword $2i$ at 204 that is an irregular codeword and a second codeword $2i+1$ at 206 that is a regular codeword. The first, irregular codeword $2i$ (204) includes a portion 208 that is stored on a first die (e.g., denoted the "left die" or the "minor die") and a portion 210 that is stored on a second die (e.g., denoted the "right die" or the "major die"), thus straddling the die boundary 212. For sake of completeness of illustration, FIG. 2 also shows the regular, non-cross-die logical pages on each side of the cross die logical page AUi 202, illustrated as AUi−1 214 and AUi+1 216. In particular, AUi−1 214 on the left die includes a first codeword CW$2i$−2 218 and a second codeword CW$2i$−1 220. Similarly, logical page AUi+1 216 on the right die includes a first codeword CW$2i$+1 222 and a second codeword CW$2i$+2 224.

Note that the terms "major die" and "minor die" pertain to cross-die logical pages. The major die is the die containing the regular or non-cross-die codeword of the logical page. Conversely, the minor die is the die containing a portion (e.g., portion 208) of the irregular or cross-die codeword of the logical page. In one aspect, the major die may also be defined as the die containing the majority portion of a cross-die logical page (i.e., greater than 50% of the logical page).

If the read operation for AUi 202 results in a decoding failure and thus a read error, read error recovery can then be used to recover the error. Two different sets of read thresholds from both dies should be managed and shifted for cross-die AU error recovery, which creates design challenges for this type of error recovery. For example, if there are around 20 or more entries in a read retry table for both dies, exhausting the read thresholds of both dies would require 400 or more retries, which could result in an unsatisfactory read retry latency from a system performance perspective.

Some SSDs may lack the hardware support to find the optimal read level of each die. Thus, the SSD control firmware and/or software relies on exhaustive searching to find the suitable read level for read error recovery. The hardware typically can only execute the read operation on a full logical page, rather than at the level of a specific codeword within the logical page (i.e. per codeword). Accordingly, exemplary methodologies disclosed herein prioritize read recovery of a regular codeword in a logical page having cross-die codewords over other codewords, irrespective of its location in the logical page with read errors.

Before discussing an exemplary method for prioritizing read recovery of codewords, it is noted that the controller 108, as one example, may include hardware, firmware, software, or any combinations thereof that implement read retry for read recovery of pages that have yielded a read error. Read retry algorithms or procedures may include the use of at least one read retry table that is used for ordering of read retries.

Figure 3:
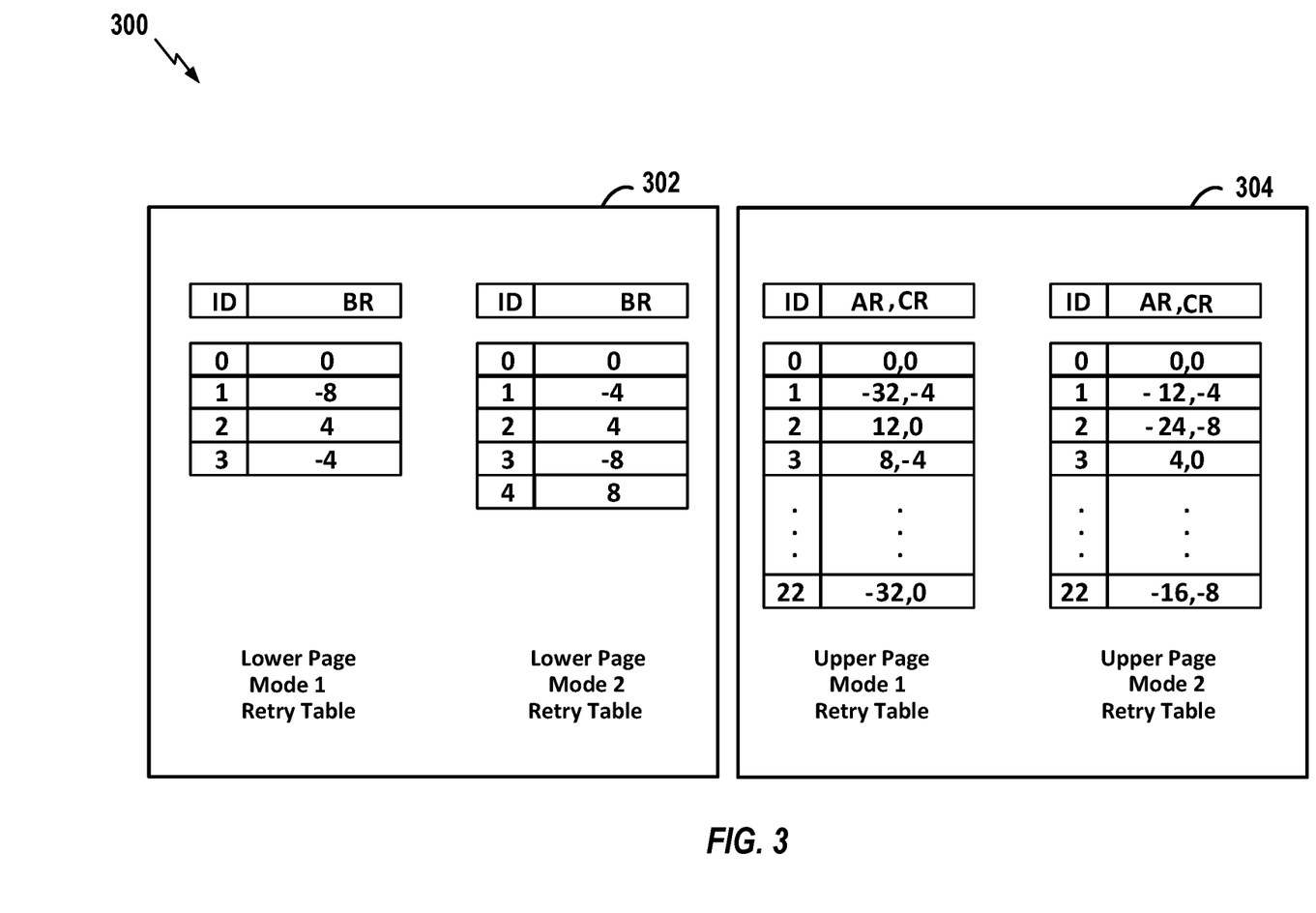
FIG. 3 illustrates an example of a static read retry table for use in an SSD.

FIG. 3 illustrates read retry tables 300, which may include a table 302 for lower pages (i.e., those pages storing least significant bits (LSBs)) and a table 304 for upper pages (i.e., those pages storing most significant bits (MSBs)). In MLC NAND Flash coding, the lower page (LP) is read by applying a read voltage level (denoted as "BR"), whereas the upper page (UP) is read by applying a pair of read voltage levels (denoted "AR" and "CR"). The tables 302 illustrate read reply tables for the lower pages, for at least a couple modes concerning different read speeds (termed "Mode 1" or "Mode 2"), respectively, where the read retry tables show application of a respective read voltage level BR in a sequential order of table entries from an ID number 0 through an ID number 4 in this example. Similarly, for upper pages, read retry tables 304 show the application of various read voltage levels AR and CR in a sequential manner for entries from an ID number 0 to an ID number 22 in this particular example.

Figure 4:
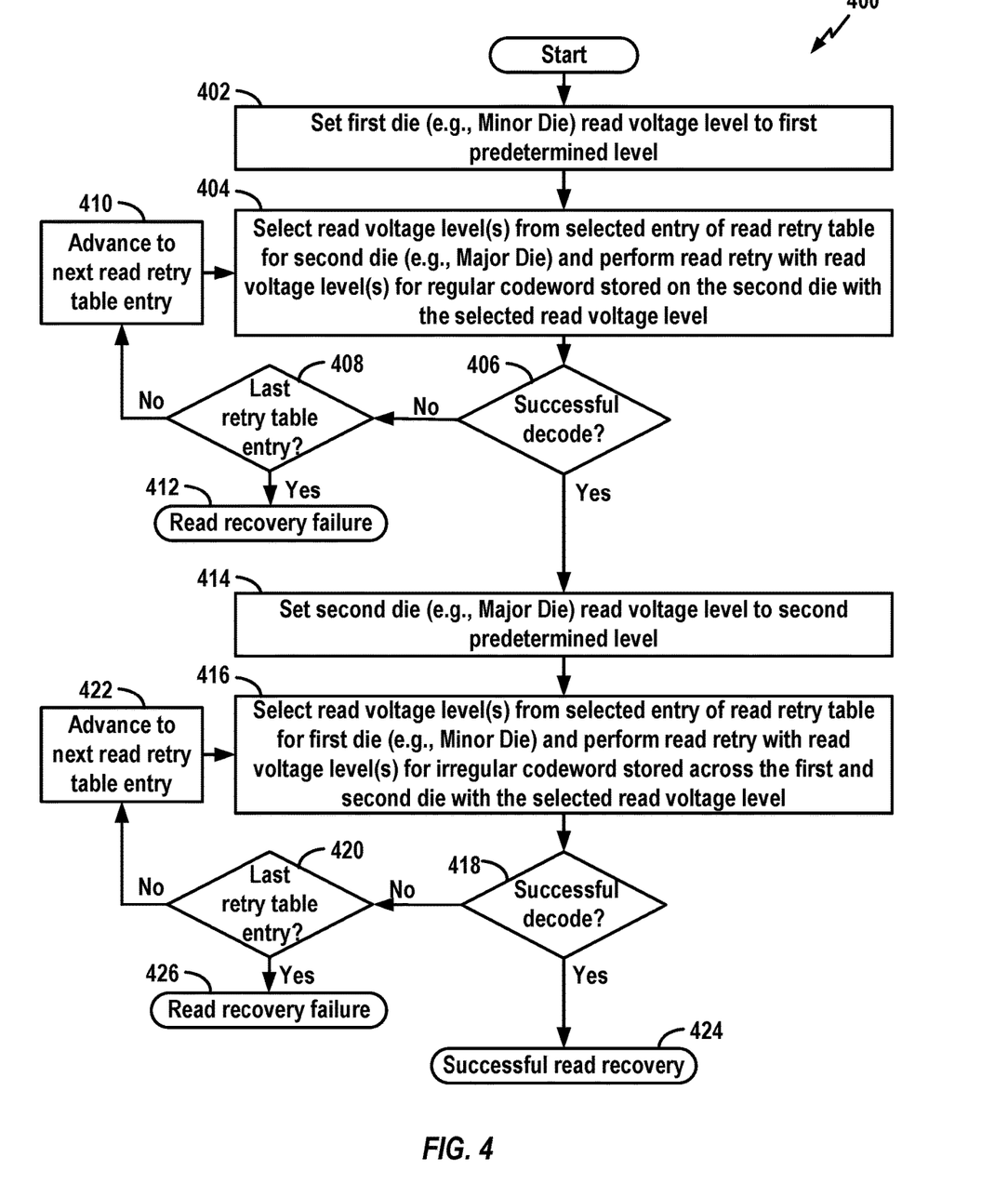
FIG. 4 illustrates a flow chart of an exemplary method for read recovery of codewords of a cross-die logical page according to aspects of the present disclosure.

FIG. 4 illustrates a flowchart of an exemplary method 400 for read recovery of codewords. Method 400 may be effectuated or performed by the NVM controller 108 of FIG. 1, for example. When a cross-die CW is extant for a logical page as was illustrated at AUi 202 in FIG. 2, method 400 starts with the controller setting or fixing a read voltage level on a first die (e.g., the minor die) at a first predetermined voltage level as shown in block 402. In an aspect, the first predetermined voltage level is a currently (or initially) considered an optimal or preferred read level. A read retry operation of the regular codeword (e.g., 206 in FIG. 2) is then performed by the controller by adjusting sequentially the read voltage level on a second die (e.g., the major die) by traversing the entries in the read retry table until successful decoding of the regular codeword is achieved, as illustrated in blocks 404, 406, 408, and 410. That is, at block 404, a read voltage level(s) is selected by the controller from a selected entry of a read retry table for second die (e.g., the Major Die) and a read retry is performed by the controller with read voltage level(s) for regular codeword stored on the second die with the selected read voltage level. If the decode at block 404 was unsuccessful, as determined by the controller at decision block 406, the controller then determines at decision block 408 whether or not it has reached the last retry table entry. If not, then the controller at block 410 advances to the nest read retry table entry and repeats the operations of block 404. If the regular codeword is not successfully recovered after traversing all entries in the read retry table (as determined at decision block 408), a read recovery failure is thus determined or detected by the controller as shown at block 412.

Alternatively, if the regular codeword is successfully recovered as determined at block 406, flow proceeds to block 414 where the read voltage level on the second die (e.g., the major die) is set or fixed by the controller to a second predetermined level. In an aspect, the second predetermined level is the read voltage level(s) that resulted in (or yielded) the successful decoding of regular codeword as determined at block 406. One reason for setting the second die read level to the successful decode read level is that the major die portion storing at least of portion of the irregular codeword (e.g., 210 in FIG. 2) is typically located closely to the portion of the major die containing the regular codeword (e.g., 206 in FIG. 2). The read voltage level that resulted in successful decoding of the regular CW is then considered the optimal or preferred read voltage level for the major die, allowing the processes of blocks 416, 418, 420, and 422 of the method 400 to set the focus on optimizing the read level of the minor die.

As such, the method 400 includes performing a read retry operation of the irregular codeword (e.g., 208 in FIG. 2) by adjusting the read level on the minor die by sequentially traversing the entries in the read retry table of the first die (e.g., the minor die) as illustrated by blocks 416, 418, 420, and 422. That is, at block 416, the controller selects read voltage level(s) from selected entry of read retry table for first die (e.g., Minor Die) and performs read retry with read voltage level(s) for irregular codeword stored across the first and second die with the selected read voltage level. If the full logical page is recovered successfully as determined by the controller at block 418 (i.e., the regular and irregular codewords are successfully recovered), a successful read error recovery is returned as shown at block 424. Alternatively, if the irregular codeword is not successfully recovered after traversing all entries in the read retry table for the first die as determined at decision blocks 418 and 420, a read recovery failure is thus determined or detected as shown at block 426. That is, upon an unsuccessful decode as determined at block 418, the controller determines, at block 420, whether the last retry table entry was reached and, if not, the controller advances to the next read retry tale entry at block 422. Otherwise, a read recovery failure is detected by the controller at block 426.

Hence, FIG. 4 illustrates an exemplary procedure wherein the read retry operation of a second codeword that is not stored across the first and second die is prioritized ahead of the read retry operation of the first codeword that is stored across the first and second die. The procedure is also configured or implemented so that a sequential advancing through entries of the read retry tables for both the first and second dies includes performing a corresponding read retry of a codeword at read voltage levels specified for each respective entry in the read retry table.

To summarize, in some examples or aspects, a controller is configured to:

1) Fix the read level on a minor die using a currently considered optimal read level, conduct a read operation adjusting the read level on the major die by traversing all the entries in the dynamic retry table until successful decoding of regular codeword (and, if the regular codeword has been found successfully recovered, processing proceeds as follows in (2); otherwise, read recovery failure is detected).

2) Fix the read level on the major die using the read level found in (1) leading to successful decoding of regular codeword, conduct read operation adjusting the read level on the minor die by visiting all of the entries in the dynamic retry table of minor die (and, if the full logical pages are recovered successfully, a successful read error recovery is announced; otherwise, read recovery failure is detected).

Figure 5A:
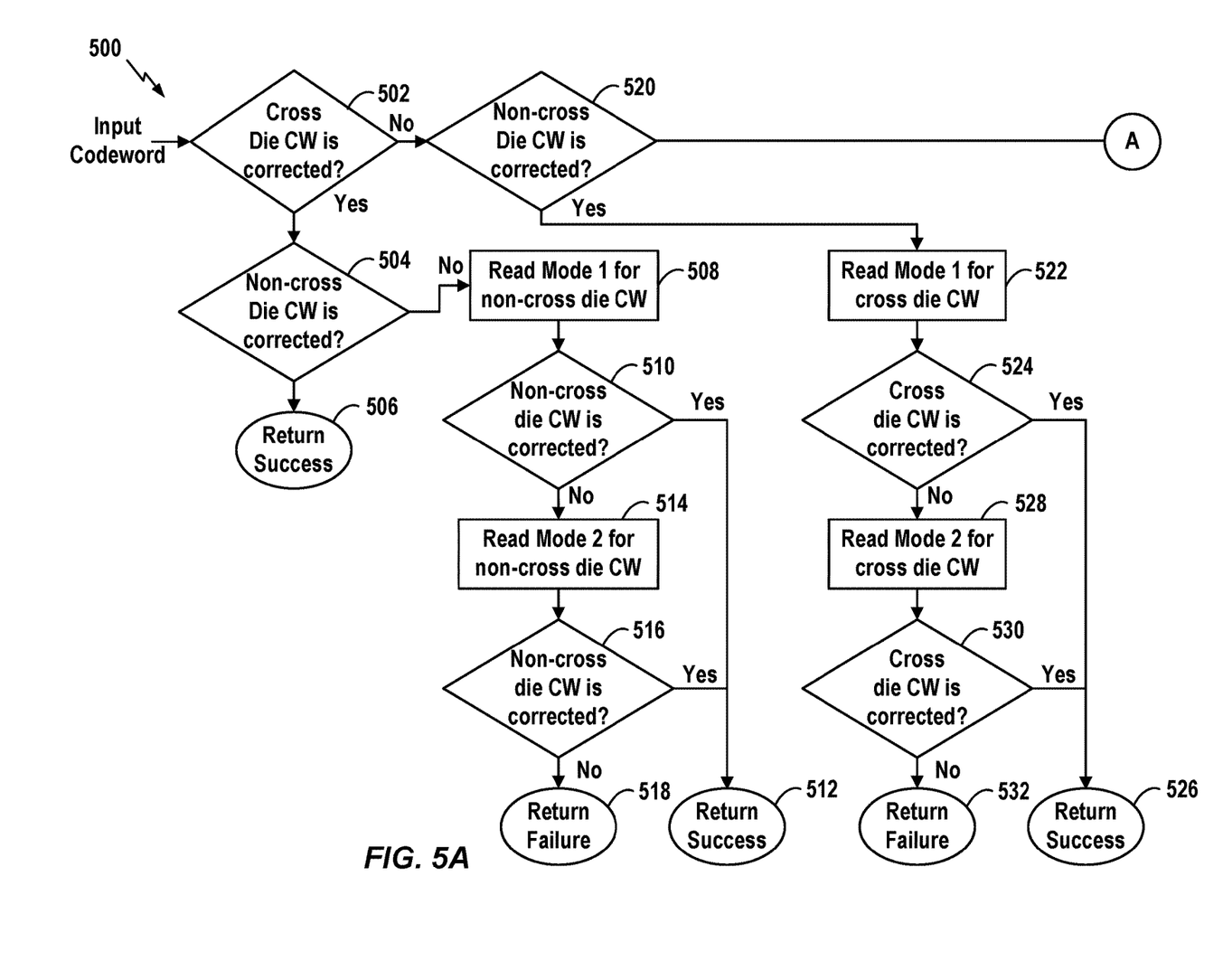
FIGS. 5A and 5B illustrate an exemplary flowchart according to another aspect of the present methodology for read recovery of codewords of a cross-die logical page.
Figure 5B:
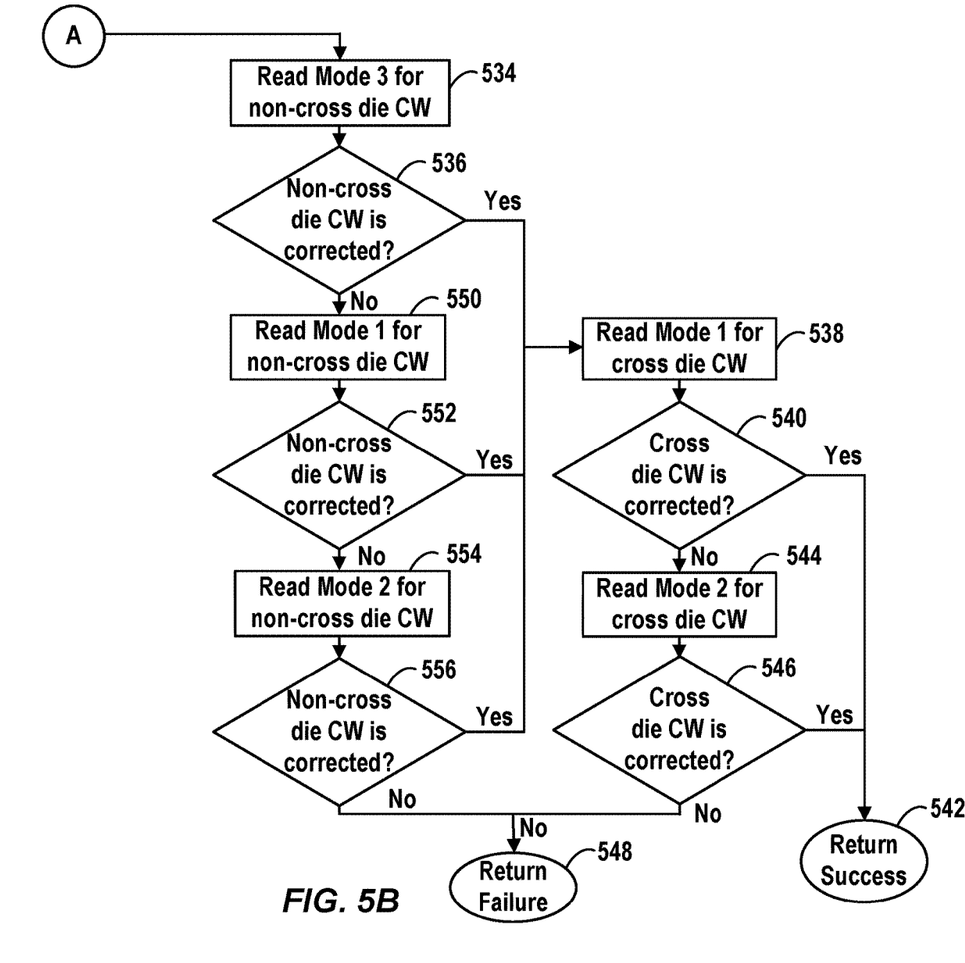

FIGS. 5A and 5B illustrate another exemplary flowchart 500 according to another aspect of the present methodology for read recovery of codewords of a cross-die logical page AU. The embodied method 500 includes three different read modes (i.e., Read Modes 1, 2, and 3), which are related to the read speed. In some examples, Read Mode 1 has a first read speed, Read Mode 2 has a second read speed, and Read Mode 3 has a third read speed, each of which read speeds is different from the others. In some examples, Read Mode 1 is the fastest of the three read speeds, Read Mode 3 is the slowest of the three read speeds, and Read Mode 2 is the faster that Read Mode 3 but slower than Read Mode 1.

Beginning at decision block 502, a component within the processor that is performing code correction (such as a component or sub-component of controller 108 of FIG. 1) determines whether the current cross-die code word has already been corrected (based on an initial or previous correction procedure) and, if so, the processor component then determines, at decision block 504, whether the current non-cross die codeword has been corrected. If both the cross die codeword and the non-cross die codeword have both been corrected, then the procedure component is complete and, a success indicator is returned by the processor component, at 506. For example, the particular processor component performing the codeword correction may return the success indictor to a supervisory component (not separately shown) of the processor that is managing the overall codeword processing, such as a supervisory component within controller 108 of FIG. 1.

Assuming, though, that either the cross die codeword or the non-cross die codeword have not yet been corrected, then various procedures are implemented to correct the code words. For example, the following block 504, Read Mode 1 is implemented by the processor component, at block 508, for processing the non-cross die codeword that has not yet been corrected. That is, Read Mode 1 is attempted to handle the situation where the cross die codeword has been corrected but the non-cross die codeword has not yet been corrected. For example, at block 508, the processor component attempts to correct the non-cross die codeword. If the correction is successful, as determined by the processor component at decision block 510, then a success indicator is once again returned, at 512, to a supervisor component of the processor. If, however, at decision block 510, it is determined that the attempt to correct the non-cross die codeword in accordance with Read Mode 1 is not successful, then Read Mode 2 is implemented at block 514 in an attempt to correct the non-cross die codeword. Again, a determination is made as to whether or not the non-cross die codeword has been corrected, at block 516, and, if so, success is again indicated at 512. Not, then a failure indicator is returned, at 518, so that the supervisory component can take other action to address the failure, such as by attempting to reread the codeword from the dies.

Returning now to decision block 502, if the decision made by the processor component is that the initial cross die codeword was not corrected, then the processor component a determines, at decision block 520, whether the non-cross die codeword has been corrected. If so then, at block 522, Read Mode 1 is again implemented by the processor component in an attempt to read the cross die codeword. At 524, a determination is made by processor component as to whether or not the cross die codeword was successfully corrected and, if so, then a success indicator is returned at 526 to the supervisory processor component. If, at 524, the cross die codeword was not corrected then, at 528, Read Mode 2 is implemented by the processor component in an effort to correct the cross die codeword. At 530, the processor component determines whether the cross die codeword was successfully corrected and, if so, a success indicator is once again returned at 526. If not, then a failure indicator is returned at 532.

Returning to decision block 520, if the processor component determines at that point that the non-cross die codeword was not corrected, then Read Mode 3 is implemented beginning at block 534. Following block 534, the processor component determines, at 536, whether the non-cross die codeword has now been corrected and, if so, Read Mode 1 is implemented beginning at block 538 to corrected the cross die codeword. At 540, a determination is made by the processor component whether or not the cross die codeword was corrected and, if yes, a success indicator is returned at 542. If, however, at decision block 540, the processor component determines that the cross die codeword was not corrected then, at 544, read mode to be implemented in an attempt to correct the cross die codeword. The processor component again determines whether the cross die codeword has been corrected, at decision block 546, and if so, success is again indicated at 542 by the processor component and, if not, failure is returned by the processor component at 548.

Returning to decision block 536, if the processor component determines at that point that the non-cross die codeword has not been corrected then pressing instead proceeds to block 550 where Read Mode 1 is implemented in an attempt to read the non-cross die codeword. Following block 550, the processor component determines, at decision block 552, whether the non-cross die codeword was successfully corrected and, if so processing proceeds to block 538 and continues as are already described. However, if the determination by the processor component at decision block 552 is that the non-cross die codeword has not yet been corrected then Read Mode 2 is implemented at block 554 two correct the non-cross die codeword. Following block 554, the processor component determines, at decision block 556, whether or not the non-cross die codeword has now been corrected. If so, processing proceeds to block 538 and continues as already described. If not, then failure is returned by the processor component at 548 to the supervisory component.

In the following, various general exemplary procedures and systems are described.

Example Process or Procedure

Figure 6:
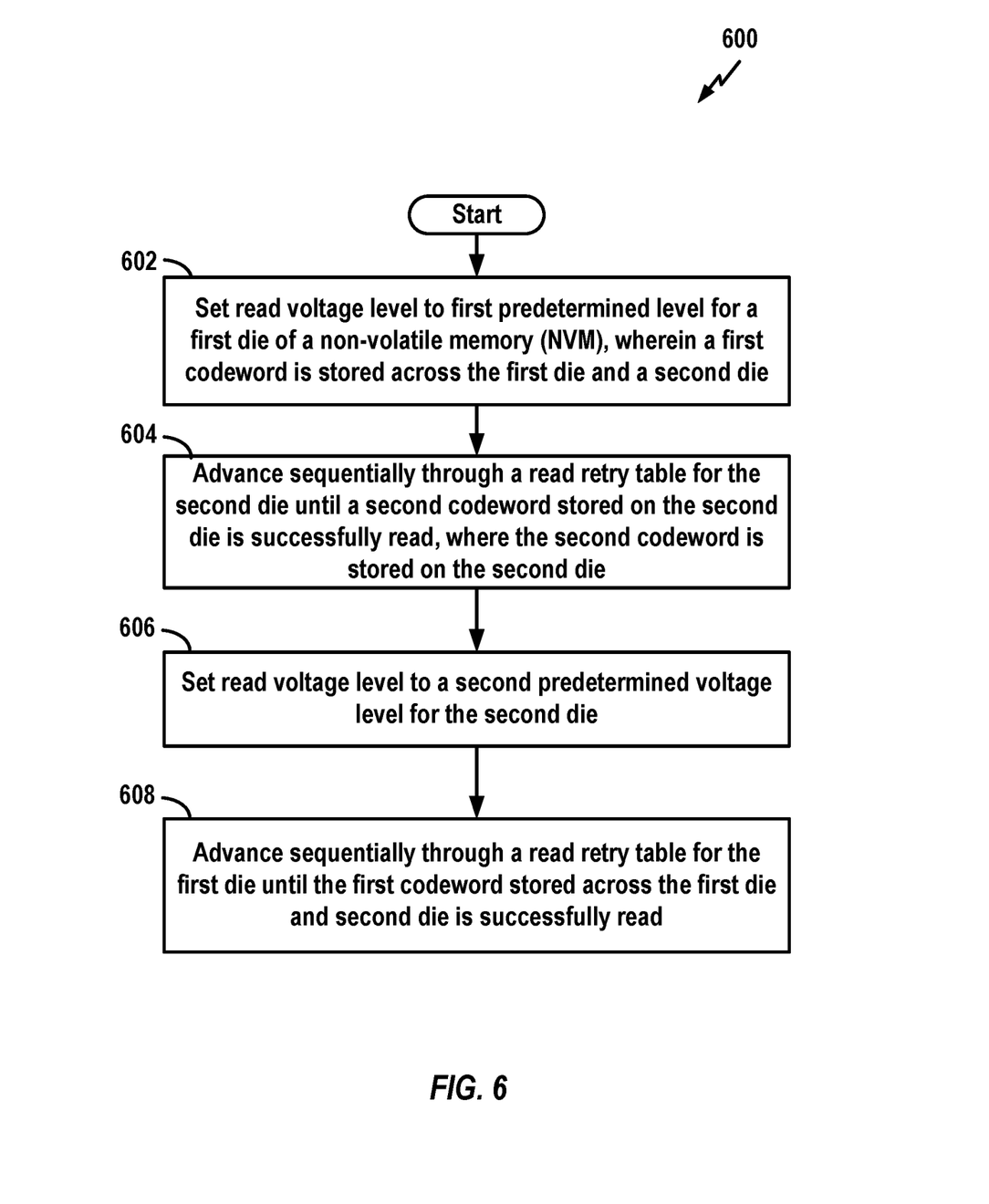
FIG. 6 illustrates an exemplary flowchart according to yet another aspect of the present methodology for read recovery of codewords of a cross-die logical page.

FIG. 6 illustrates an exemplary flowchart 600 according to an aspect of the present methodology for read recovery of codewords of a cross-die logical page. Method 600 includes setting a read voltage level, as shown at block 602, to first predetermined level for a first die of an NVM that includes first and second dies, wherein a first codeword is stored across the first die and the second die. In a particular example, the process 602 includes setting the read voltage level to the current optimal read voltage level for the first or "minor" die. After setting the voltage in process 602, the non-cross die codeword is attempted to be decoded; thus the non-cross die codeword or regular codeword is prioritized for read retry ahead of read retry for the cross-die codeword. In particular, method 600 includes advancing sequentially through a read retry table, as shown in block 604, for the second die until the second codeword stored on the second die is successfully read, where the second codeword is stored (only) on the second die. It is noted that, in an aspect, if the process 604 does not result in a successful decoding of the non-cross die codeword, a read failure may be returned to the NVM controller or host, as was described earlier with respect to FIG. 4.

After the process in block 604 is completed, the method 600 includes setting the read voltage level for the second die to a second predetermined voltage level as shown in block 606. In an aspect, the second predetermined voltage level is that voltage that was used to successfully decode the second codeword in the process of block 604. Method 600 also includes advancing sequentially through a read retry table for the first die until the first codeword stored across the first die and the second die is successfully read, as indicated at block 608. In some aspects, the first predetermined voltage comprises or includes or corresponds to a predetermined optimal read retry voltage for the first die. In some other aspects, the second predetermined voltage comprises or includes or corresponds to a read retry voltage that resulted in the successful reading of the second codeword on the second die. In still some other aspects, the first and second codewords are part of a single logical page. In still some other aspects, the read retry operation of the second codeword that is not stored across the first and second die is prioritized ahead of the read retry operation of the first codeword that is stored across the first and second die. In still other aspects, the sequential advancing through entries of the read retry tables for both the first and second die includes performing a corresponding read retry of a codeword at read voltage levels specified for each respective entry in the read retry table. In still further aspects, the sequential advancing through entries of the read retry tables for both the first and second die includes performing a corresponding read retry of a codeword at read voltage levels specified for each respective entry in the read retry table. These additional aspects were described above.

First Example Apparatus

Figure 7:
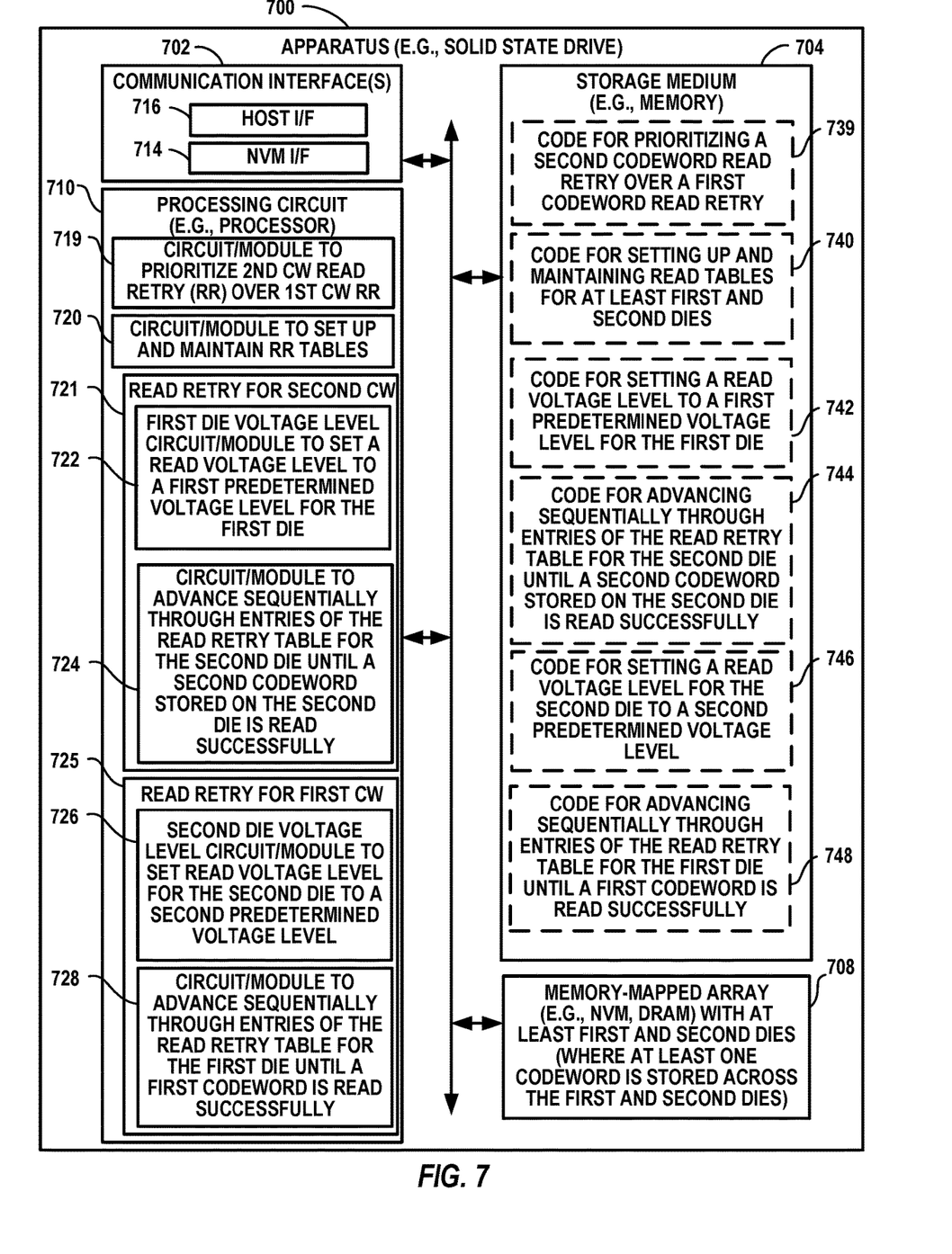
FIG. 7 illustrates another schematic block diagram configuration for an exemplary SSD having one or more NVM arrays.

FIG. 7 illustrates an embodiment of an apparatus 700 configured according to one or more aspects of the disclosure. The apparatus 700, or components thereof, could embody or be implemented within an SSD controller, a host device, an NVM device, a NAND die, or some other type of device that supports data storage. In various implementations, the apparatus 700, or components thereof, could embody or be implemented within a computing device, a personal computer, a portable device, or workstation, a server, a personal digital assistant, a digital camera, a digital phone, an entertainment device, a medical device, or any other electronic device that stores data.

The apparatus 700 includes a communication interface 702, a storage medium 704, a physical memory array (e.g., an NVM memory circuit) 708, and a processing circuit 710 (e.g., at least one processor and/or other suitable circuitry). These components can be coupled to and/or placed in electrical communication with one another via a signaling bus or other suitable component, represented generally by the connection lines in FIG. 7. The signaling bus may include any number of interconnecting buses and bridges depending on the specific application of the processing circuit 710 and the overall design constraints. The signaling bus links together various circuits such that each of the communication interface 702, the storage medium 704, and the memory array 708 are coupled to and/or in electrical communication with the processing circuit 710. The signaling bus may also link various other circuits (not shown) such as timing sources, peripherals, voltage regulators, and power management circuits, which are well known in the art, and therefore, will not be described any further.

The communication interface 702 provides a means for communicating with other apparatuses over a transmission medium. In some implementations, the communication interface 702 includes circuitry and/or programming (e.g., a program) adapted to facilitate the communication of information bi-directionally with respect to one or more devices in a system. In some implementations, the communication interface 702 may be configured for wire-based communication. For example, the communication interface 702 could be a bus interface, a send/receive interface, or some other type of signal interface including drivers, buffers, or other circuitry for outputting and/or obtaining signals (e.g., outputting signal from and/or receiving signals into an integrated circuit). The communication interface 702 serves as one example of a means for receiving and/or a means for transmitting.

The memory array 708 may represent one or more memory devices. In some implementations, the memory array 708 and the storage medium 704 are implemented as a common memory component. The memory array 708 may be used for storing data that is manipulated by the processing circuit 710 or some other component of the apparatus 700. In the example of FIG. 7, the memory array 708 includes at least first and second dies (where at least one codeword is stored across the first and second dies).

The storage medium 704 may represent one or more computer-readable, machine-readable, and/or processor-readable devices for storing programming, such as processor executable code or instructions (e.g., software, firmware), electronic data, databases, or other digital information. The storage medium 704 may also be used for storing data that is manipulated by the processing circuit 710 when executing programming. The storage medium 704 may be any available media that can be accessed by a general purpose or special purpose processor, including portable or fixed storage devices, optical storage devices, and various other mediums capable of storing, containing or carrying programming.

By way of example and not limitation, the storage medium 704 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a RAM, ROM, PROM, EPROM, an EEPROM, ReRAM, a register, a removable disk, and any other suitable medium for storing software and/or instructions that may be accessed and read by a computer. The storage medium 704 may be embodied in an article of manufacture (e.g., a computer program product). By way of example, a computer program product may include a computer-readable medium in packaging materials. In view of the above, in some implementations, the storage medium 704 may be a non-transitory (e.g., tangible) storage medium. For example, the storage medium 704 may be a non-transitory computer-readable medium storing computer-executable code, including code to perform operations as described herein.

The storage medium 704 may be coupled to the processing circuit 710 such that the processing circuit 710 can read information from, and write information to, the storage medium 704. That is, the storage medium 704 can be coupled to the processing circuit 710 so that the storage medium 704 is at least accessible by the processing circuit 710, including examples where at least one storage medium is integral to the processing circuit 710 and/or examples where at least one storage medium is separate from the processing circuit 710 (e.g., resident in the apparatus 700, external to the apparatus 700, distributed across multiple entities, etc.).

Programming stored by the storage medium 704, when executed by the processing circuit 710, causes the processing circuit 710 to perform one or more of the various functions and/or process operations described herein. For example, the storage medium 704 may include operations configured for regulating operations at one or more hardware blocks of the processing circuit 710, as well as to utilize the communication interface 702 for wireless communication utilizing their respective communication protocols.

The processing circuit 710 is generally adapted for processing, including the execution of such programming stored on the storage medium 704. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 710 is arranged to obtain, process and/or send data, control data access and storage, issue commands, and control other desired operations. The processing circuit 710 may include circuitry configured to implement desired programming provided by appropriate media in at least one example. For example, the processing circuit 710 may be implemented as one or more processors, one or more controllers, and/or other structure configured to execute executable programming Examples of the processing circuit 710 may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 710 may also be implemented as a combination of computing components, such as a combination of a controller and a microprocessor, a number of microprocessors, one or more microprocessors in conjunction with an ASIC and a microprocessor, or any other number of varying configurations. These examples of the processing circuit 710 are for illustration and other suitable configurations within the scope of the disclosure are also contemplated.

According to one or more aspects of the disclosure, the processing circuit 710 may be adapted to perform any or all of the features, processes, functions, operations and/or routines for any or all of the apparatuses described herein. For example, the processing circuit 710 may be configured to perform any of the steps, functions, and/or processes described with respect to FIGS. 1-6. As used herein, the term "adapted" in relation to the processing circuit 710 may refer to the processing circuit 710 being one or more of configured, employed, implemented, and/or programmed to perform a particular process, function, operation and/or routine according to various features described herein. The processing circuit 710 may be a specialized processor, such as an ASIC that serves as a means for (e.g., structure for) carrying out any one of the operations described in conjunction with FIGS. 1-6. The processing circuit 710 serves as one example of a means for sending and/or a means for receiving. In various implementations, the processing circuit 710 may provide and/or incorporate, at least in part, the functionality described above for the controller 108 of FIG. 1.

According to at least one example of the apparatus 700, the processing circuit 710 may include one or more of: a circuit/module 719 configured to prioritize a second (2nd) codeword read retry over a first (1st) codeword read retry; a circuit/module 720 configured to set up and maintain read retry tables for at least first and second dies (where circuit/module 720 may also be referred to as a read table controller or manager); a circuit/module 721 configured to perform a read retry operation for the second codeword by setting a read voltage level to a first predetermined voltage level for the first die, and advancing sequentially through entries of a read retry table for the second die until the second codeword stored is read successfully; and a circuit/module 725 configured to perform a read retry operation for the first codeword by setting a read voltage level for the second die to a second predetermined voltage level, and advancing sequentially through entries of a read retry table for the first die until the first codeword stored across the first and second dies is successfully read.

In the example, of FIG. 7, the circuit/module 721 for performing the read retry operation for the second codeword includes: a circuit/module 722 configured to set a read voltage level to a first predetermined voltage level for the first die (where circuit/module 722 may also be referred first die voltage level controller or manager); and a circuit/module 724 configured to advance sequentially through entries of the read retry table for the second die until a second codeword stored on the second die is read successfully (where circuit/module 724 may also be referred to as a second code word read controller or manager). The circuit/module 725 for performing the read retry operation for the first codeword includes: a circuit/module 726 configured to set a read voltage level for the second die to a second predetermined voltage level (where circuit/module 726 may also be referred to as a second die voltage level controller or manager); and a circuit/module 728 configured to advance sequentially through entries of the read retry table for the first die until a first codeword is read successfully (where circuit/module 728 may also be referred to as a second code word read controller or manager).

As mentioned above, a program stored by the storage medium 704, when executed by the processing circuit 710, causes the processing circuit 710 to perform one or more of the various functions and/or process operations described herein. For example, the program may cause the processing circuit 710 to perform the various functions, steps, and/or processes described herein with respect to FIGS. 1-6 in various implementations. As shown in FIG. 7, the storage medium 704 may include one or more of: code 739 for prioritizing a second codeword read retry over a first codeword read retry; code 740 for setting up and maintaining read retry tables for at least first and second dies where a first codeword is stored across the first die and a second die; code 742 for setting a read voltage level to a first predetermined voltage level for the first die; code 744 for advancing sequentially through entries of the read retry table for the second die until a second codeword stored on the second die is read successfully (where the second codeword is stored only on the second die); code 746 for setting a read voltage level for the second die to a second predetermined voltage level; and code 748 for advancing sequentially through entries of the read retry table for the first die until the first codeword is read successfully.

In at least some examples, means may be provided for performing the functions illustrated in FIG. 7 and/or other functions illustrated or described herein. For example, the means may include one or more of: means, such as circuit/module 719, for prioritizing a second codeword read retry over a first codeword read retry; means, such as circuit/module 720, for setting up and maintaining read retry tables for at least first and second dies where a first codeword is stored across the first die and a second die; means, such as circuit/module 721, for performing a read retry for a second codeword; means, such as circuit/module 722, for setting a read voltage level to a first predetermined voltage for the first die; means, such as circuit/module 724, for advancing sequentially through entries of the read retry table for the second die until a second codeword stored on the second die is read successfully (where the second codeword is stored only on the second die); means, such as circuit/module 725, for performing a read retry for a first codeword; means, such as circuit/module 726 for setting a read voltage level for the second die to a second predetermined voltage level; and means, such as circuit/module 728 for advancing sequentially through entries of the read retry table for the first die until the first codeword is read successfully. The means for advancing sequentially through entries of the read retry table for the second die and the means for advancing sequentially through entries of the read retry table for the first die both include means, such as controller 108, for performing a corresponding read retry of a codeword at read voltage levels specified for each respective entry in the read retry tables.

Second Example Apparatus

Figure 8:
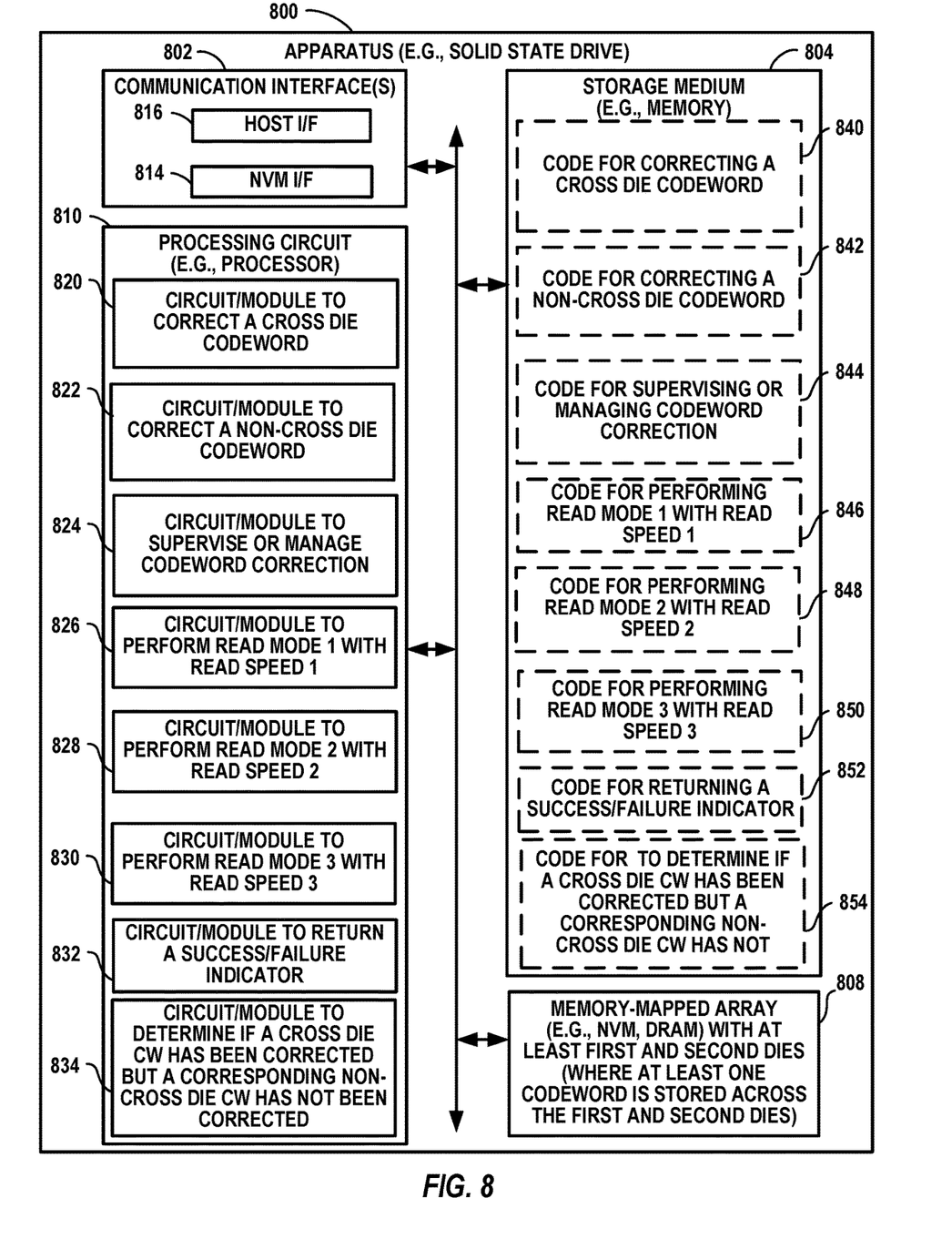
FIG. 8 illustrates still another schematic block diagram configuration for an exemplary SSD having one or more NVM arrays.

FIG. 8 illustrates another embodiment of an apparatus 800 configured according to one or more aspects of the disclosure. The apparatus 800, or components thereof, could embody or be implemented within an SSD or some other type of device that stores data. The apparatus 800 includes a communication interface 802, a storage medium 804, a user interface 806, a physical memory array 808 (e.g., NVM, DRAM, etc.), and a processing circuit 810 (e.g., at least one processor and/or other suitable circuitry). The communication interface 802 may be coupled to one or more antennas 812, and may include a transmitter 814 and a receiver 816. The memory-mapped array may again include at least first and second dies where at least one codeword is stored across the first and seconds dies.

In general, the components of FIG. 8 may be similar to corresponding components of the apparatus 1400 of FIG. 14. The processing circuit 810 may be adapted to perform any or all of the features, processes, functions, operations and/or routines for any or all of the apparatuses described herein. The processing circuit 810 may be a specialized processor, such as an ASIC that serves as a means for (e.g., structure for) carrying out any one of the operations described in conjunction with FIGS. 1-6. The processing circuit 810 serves as one example of a means for sending and/or a means for receiving. In various implementations, the processing circuit 810 may provide and/or incorporate, at least in part, the functionality described above for the controller 108 of FIG. 1.

According to at least one example of the apparatus 800, the processing circuit 810 may include one or more of: a circuit/module 820 to correct cross die codewords; a circuit/module 822 to correct non-cross die codewords; a circuit/module 824 to supervise or manage codeword correction; a circuit/module 826 to perform Read Mode 1 with read speed 1 (e.g., as discussed above); a circuit/module 828 to perform Read Mode 2 with read speed 2 (e.g., as discussed above);

a circuit/module 830 to perform Read Mode 3 with read speed 3 (e.g., as discussed above); a circuit/module 832 to return a success or failure indicator (e.g., as discussed above); and a circuit/module 834 to determine if a cross die codeword has been corrected but a corresponding non-cross die codeword has not been corrected and, if so, to perform a read procedure of a first type having a first read speed to correct the non-cross die codeword. The circuit/module 834 may also determine, after performing the read procedure of the first type, if the non-cross die codeword is still not corrected and, if so, perform a read procedure of a second type having a second read speed to correct the non-cross die codeword.

As noted, programming stored by the storage medium 804, when executed by the processing circuit 810, causes the processing circuit 810 to perform one or more of the various functions and/or process operations described herein. For example, the programming may cause the processing circuit 810 to perform the various functions, steps, and/or processes described herein with respect to FIGS. 1-6 in various implementations. As shown in FIG. 8, the storage medium 804 may include one or more of: code 840 for correcting cross die codewords; code 842 for correcting non-cross die codewords; code 844 for supervising or managing codeword correction; code 846 for performing Read Mode 1; code 848 for performing Read Mode 2; code 850 for performing Read Mode 3; code 852 for returning a success or failure indictor; and code 854 for determining if a cross die codeword has been corrected but a corresponding non-cross die codeword has not been corrected and, if so, for performing a read procedure of a first type having a first read speed to correct the non-cross die codeword. The code 854 may also determine, after performing the read procedure of the first type, if the non-cross die codeword is still not corrected and, if so, perform a read procedure of a second type having a second read speed to correct the non-cross die codeword.

In at least some examples, means may be provided for performing the functions illustrated in FIG. 8 and/or other functions illustrated or described herein. For example, the means may include one or more of: means, such as circuit/module 820, for correcting cross die codewords; means, such as circuit/module 822, for correcting non-cross die codewords; means, such as circuit/module 824, for supervising or managing codeword correction; means, such as circuit/module 826, for performing a first read mode (Read Mode 1); means, such as circuit/module 828, for performing a second read mode (Read Mode 2); means, such as circuit/module 830, for performing a third read mode (Read Mode 3); means, such as circuit/module 832, for returning a success or failure indicator; and means, such as circuit/module 834, for determining if a cross die codeword has been corrected but a corresponding non-cross die codeword has not been corrected and, if so, for performing a read procedure of a first type having a first read speed to correct the non-cross die codeword. Means may also be provided to determine, after performing the read procedure of the first type, if the non-cross die codeword is still not corrected and, if so, to perform a read procedure of a second type having a second read speed to correct the non-cross die codeword.

Additional Aspects

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" is intended to cover A, B, C, A-B, A-C, B-C, and A-B-C, as well as multiples of the same members (e.g., any lists that include AA, BB, or CC). Likewise, "at least one of: A, B, and C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. An apparatus, comprising:
a memory array with first and second dies, wherein a first codeword is stored across the first and second dies and a second codeword is stored on the second die; and
a processor configured to
perform a read retry operation for the second codeword by setting a read voltage level to a first predetermined voltage level for the first die, and advancing sequentially through entries of a read retry table for the second die until the second codeword is read successfully,
perform a read retry operation for the first codeword by setting a read voltage level for the second die to a second predetermined voltage level, and advancing sequentially through entries of a read retry table for the first die until the first codeword is successfully read.

2. The apparatus of claim 1, wherein the processor is further configured to prioritize the read retry operation for the second codeword over the read retry operation for the first codeword.

3. The apparatus of claim 1, wherein the processor is further configured to set up and maintain the read retry table of the first die and the read retry table of the second die.

4. The apparatus of claim 1, wherein the processor comprises a circuit configured to set the read voltage level to the first predetermined voltage level for the first die as part of the read retry operation for the second codeword.

5. The apparatus of claim 4, wherein the processor comprises a circuit configured to advance sequentially through the entries of the read retry table for the second die until the second codeword is read successfully.

6. The apparatus of claim 1, wherein the processor comprises a circuit configured to set the read voltage level to the second predetermined voltage level for the second die as part of the read retry operation for the first codeword.

7. The apparatus of claim 6, wherein the processor comprises a circuit configured to advance sequentially through the entries of the read retry table for the first die until the first codeword is read successfully.

8. The apparatus of claim 1,
wherein the first predetermined voltage level comprises a predetermined read retry voltage for the first die, and
wherein the second predetermined voltage level comprises a read retry voltage that resulted in the successful reading of the second codeword on the second die.

9. The apparatus of claim 1, wherein the first and second codewords are part of a single logical page.

10. The apparatus of claim 1, wherein the apparatus is a solid state device (SSD) and the memory array is a non-volatile memory (NVM) array.

11. A method for operating a solid state device (SSD) including a non-volatile memory (NVM) having first and second dies, the method comprising:
setting a read voltage level to a first predetermined level for the first die of the NVM, wherein a first codeword is stored across the first die and the second die of the NVM;
advancing sequentially through entries of a read retry table for the second die until a second codeword stored on the second die is read successfully, wherein the second codeword is stored only on the second die;
setting a read voltage level for the second die to a second predetermined voltage level; and
advancing sequentially through entries of a read retry table for the first die until the first codeword stored across the first die and the second die is successfully read.

12. The method of claim 11,
wherein the sequential advance through the entries of the read retry table for the second die comprises a read retry operation for the second codeword;
wherein the sequential advance through the entries of the read retry table for the first die comprises a read retry operation for the first codeword; and
wherein the read retry operation for the second codeword is prioritized ahead of the read retry operation for the first codeword.

13. The method of claim 11, wherein the sequential advance through entries of the read retry tables for both the first and second dies includes a corresponding read retry of a codeword at read voltage levels specified for each respective entry in the read retry tables.

14. The method of claim 11, wherein the sequential advance through entries of the read retry tables for both the first and second dies includes a corresponding read retry of a codeword at read voltage levels specified for each respective entry in the read retry tables.

15. The method of claim 11, further comprising determining if a cross die codeword has been corrected but a corresponding non-cross die codeword has not been corrected and, if so, performing a read procedure of a first type having a first read speed to correct the non-cross die codeword.

16. The method of claim 15, after performing the read procedure of the first type, determining if the non-cross die codeword is still not corrected and, if so, performing a read procedure of a second type having a second read speed to correct the non-cross die codeword.

17. The method of claim 11, further comprising determining if neither a cross die codeword nor a corresponding non-cross die codeword have been corrected and, if so, performing a read procedure of a third type having a third read speed to correct the non-cross die codeword.

18. The method of claim 17, after performing the read procedure of the third type, determining if the non-cross die codeword is still not corrected and, if so, performing a read procedure of a first type to correct the non-cross die codeword.

19. An apparatus, comprising:
means for maintaining a read retry tables for a first die and a second die of a non-volatile memory (NVM);
means for setting a read voltage level to a first predetermined level for the first die, where a first codeword is stored across the first die and a second die of the NVM;
means for advancing sequentially through entries of the read retry table for the second die until a second codeword stored on the second die is read successfully, wherein the second codeword is stored on the second die;
means for setting a read voltage level for the second die to a second predetermined voltage level; and
means for advancing sequentially through entries of the read retry table for the first die until the first codeword is successfully read.

20. The apparatus of claim 19, wherein the means for advancing sequentially through entries of the read retry table for the second die and the means for advancing sequentially through entries of the read retry table for the first die both include means for performing a corresponding read retry of a codeword at read voltage levels specified for each respective entry in the read retry tables.

* * * * *